United States Patent [19]

Abe

[11] Patent Number: 5,003,476

[45] Date of Patent: Mar. 26, 1991

[54] DIAGNOSTIC SYSTEM FOR A MOTOR VEHICLE

[75] Inventor: Kunihiro Abe, Higashimurayama, Japan

[73] Assignee: Fuji Jukogyo Kabushiki Kaisha, Tokyo, Japan

[21] Appl. No.: 401,953

[22] Filed: Sep. 1, 1989

[30] Foreign Application Priority Data

Sep. 7, 1988 [JP]   Japan .................................. 63-224994

[51] Int. Cl.$^5$ ............................................. G06F 15/16
[52] U.S. Cl. ............................ 364/424.03; 364/424.04; 73/117.3
[58] Field of Search ....................... 364/424.03, 424.04; 307/9.1, 10.1; 73/117.2, 117.3

[56]   References Cited

U.S. PATENT DOCUMENTS

| 4,694,408 | 9/1987 | Zaleski ............................ 364/431.01 |
| 4,748,843 | 6/1988 | Schäfer et al. ...................... 73/117.3 |
| 4,760,275 | 7/1988 | Sato et al. ......................... 307/10.1 |
| 4,787,041 | 11/1988 | Yount ............................. 364/424.03 |

FOREIGN PATENT DOCUMENTS 58-12848   1/1983   Japan .

Primary Examiner—Parshotam S. Lall
Assistant Examiner—Tyrone Queen
Attorney, Agent, or Firm—Martin A. Farber

[57]   ABSTRACT

A diagnostic system for diagnosing an electronic control system mounted on a vehicle has a diagnostic device including a call signal transmitter for transmitting a call signal to the electronic control system. The electronic control system has a call signal receiver for receiving the call signal and a data transmitter for transmitting diagnosis data to the diagnostic device. In response to the call signal, the call signal receiver operates to render the data transmitter in a signal responsive state.

5 Claims, 12 Drawing Sheets

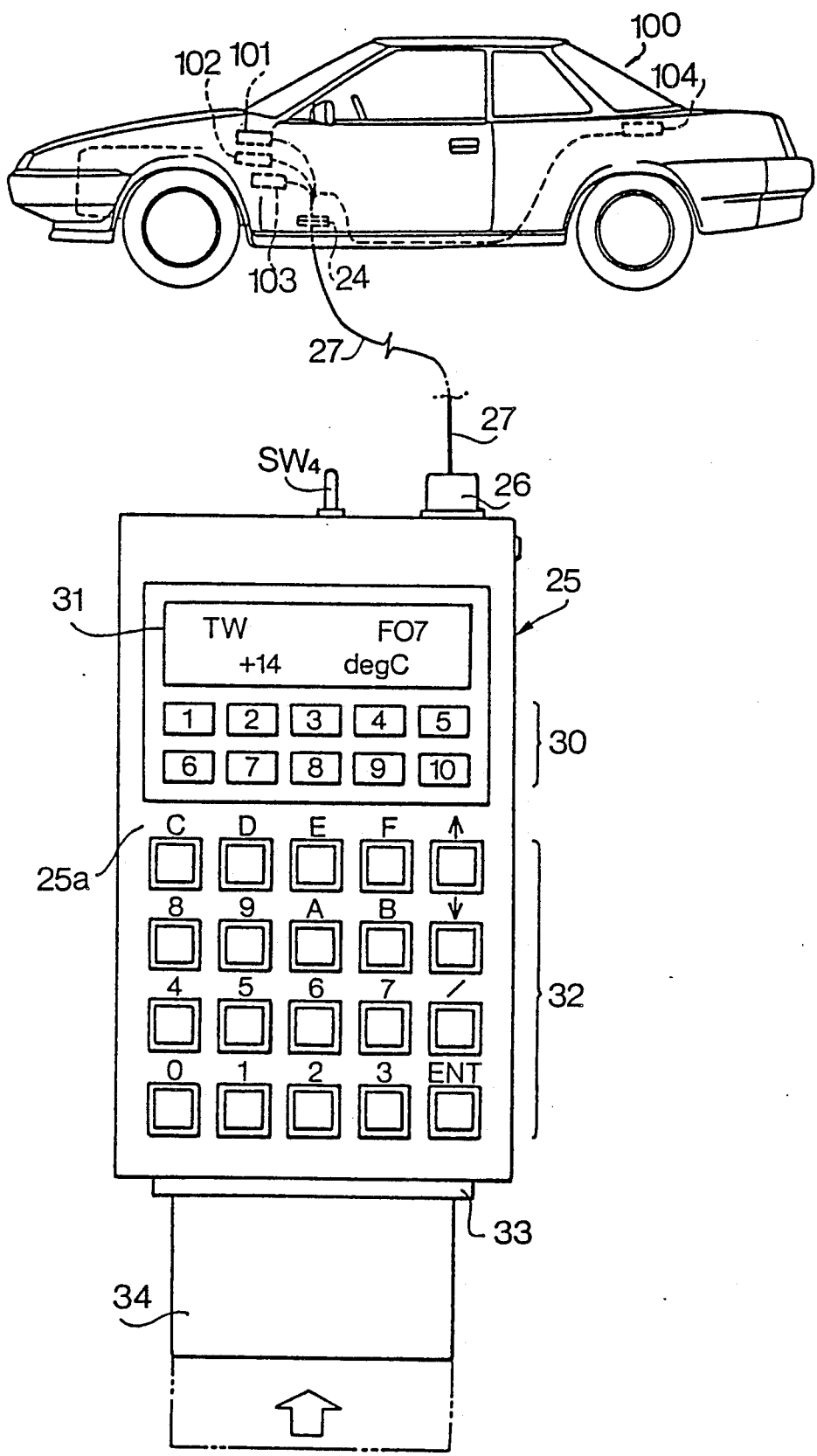
F I G. 5

DIAGNOSTIC SYSTEM FOR A MOTOR VEHICLE

BACKGROUND OF THE INVENTION

The present invention relates to a diagnostic system for a motor vehicle.

Recently, a motor vehicle has been equipped with an electronic control system for controlling various components of an engine, such as fuel injectors, thereby improving driveability, exhaust gas emission, fuel consumption and engine power. The electronic control system controls the components based on information represented by output signals from various sensors for detecting engine operating conditions. Accordingly, if malfunctions of components and sensors occur, the engine does not properly operate.

However, because of the complexity of the electronic control system, it is difficult to immediately find out the trouble. Accordingly, a diagnostic device for easily checking the electronic control system should be provided as equipment in an auto shop. The electronic control system has a memory and a communication system to be connected to the diagnostic device.

Japanese Patent Application Laid-Open 58-12848 discloses a diagnostic system in which a bidirectional communication system is provided between the electronic control system and the diagnostic device, thereby diagnosing data based on output signals from various sensors and control data for various actuators in the control system.

When the electronic control system is communicated with the diagnostic device and the diagnosis operation starts, the control system continuously transmits the data signal to the diagnostic device. Accordingly, the load exerted on a central processor unit (CPU) provided in the control system becomes extremely large.

If the speed of the engine increases to a high speed during the continuous data transmission from the control system to the diagnostic device, execution of control programs of the control system such as fuel injection control and ignition timing control is affected by the large load on the CPU. As a result, fuel injection and ignition timing can not be properly controlled.

In order to solve such problems, a demand signal demanding termination of the data transmission is applied from the diagnostic device to the control system. After the control system receives the data transmission terminating demand signal and interprets the termination of the data transmission, the control system stops transmitting data. Consequently, it takes time before termination of the data transmission, which may cause malfunctioning of the engine.

Further, there is another motor vehicle having a plurality of control units for controlling the engine, transmission, brake and cruise control. When these control units are diagnosed, the control units are connected in parallel to the diagnostic device through a pair of bus lines. The diagnostic device sends a particular control unit designating signal to all control units through one of the bus lines. In response to the particular control unit designating signal, each control unit determines whether the control unit itself is designated or not. A designated control unit is connected with the diagnostic device through the bus lines, and hence the other control units are excluded from the bus lines.

When the designated control unit is in communication with the diagnostic device, the control unit continuously transmits signals to the diagnostic device through the bus lines. Under such a condition, other control units are not diagnosed. In order to diagnose another control unit, the diagnostic device produces a data transmission terminating demand signal which is applied to all control units. After the control unit in communication with the diagnostic device stops transmitting the data transmission in response to the transmission terminating demand signal, the newly designated control unit is connected to the diagnostic device to start data transmission. However, since the communication procedure is complicated, it takes a long time to diagnose a plurality of control units.

Consequently, it is difficult to quickly change the communication between the control unit and the diagnostic device. Thus, diagnosis operation for a plurality of control units can not be quickly performed.

SUMMARY OF THE INVENTION

An object of the present invention is to provide a diagnostic system in which the data transmission condition between an electronic control system and a diagnostic device can be quickly changed without using a complicated communication procedure.

Another object of the present invention is to provide a diagnostic system in which diagnosis operations for a plurality of electronic control systems can be accurately performed for a short time, thereby improving workability.

According to the present invention, there is provided a diagnostic system for diagnosing an electronic control system for an automotive engine of a motor vehicle, the electronic control system having detector means for detecting operating conditions of the engine and vehicle, and means for storing input data from the detector means and providing output data for controlling the engine and vehicle, the diagnostic system having a diagnostic device, and a connector for connecting the diagnostic device with the electronic control system, the diagnostic device having a diagnosis control unit responsive to the output data for diagnosing the output data and for providing diagnosis data, a display for displaying the diagnosis data, a keyboard for inputting a signal into the diagnosis control unit.

The diagnostic system comprises a call signal line connecting the diagnostic device with the electronic control system through the connector, call signal transmitting means provided in the diagnostic device for transmitting a call signal corresponding to the electronic control system to the electronic control system through the call signal line, data transmitting means provided in the electronic control system for transmitting an output signal to the diagnostic device, call signal receiving means provided in the electronic control system for receiving the call signal and for rendering the data transmitting means in a signal responsive state in accordance with the call signal.

In an aspect of the invention, the electronic control system comprises a plurality of operation control units, and the operation control units are connected with the diagnostic device through respective call signal lines.

The other objects and features of this invention will become understood from the following description with reference to the accompanying drawings.

BRIEF DESCRIPTION OF DRAWINGS

FIG. 5 is a schematic illustration of a second embodiment of the present invention;

DETAILED DESCRIPTION OF THE PREFERRED EMBODIMENTS

Figure 1:
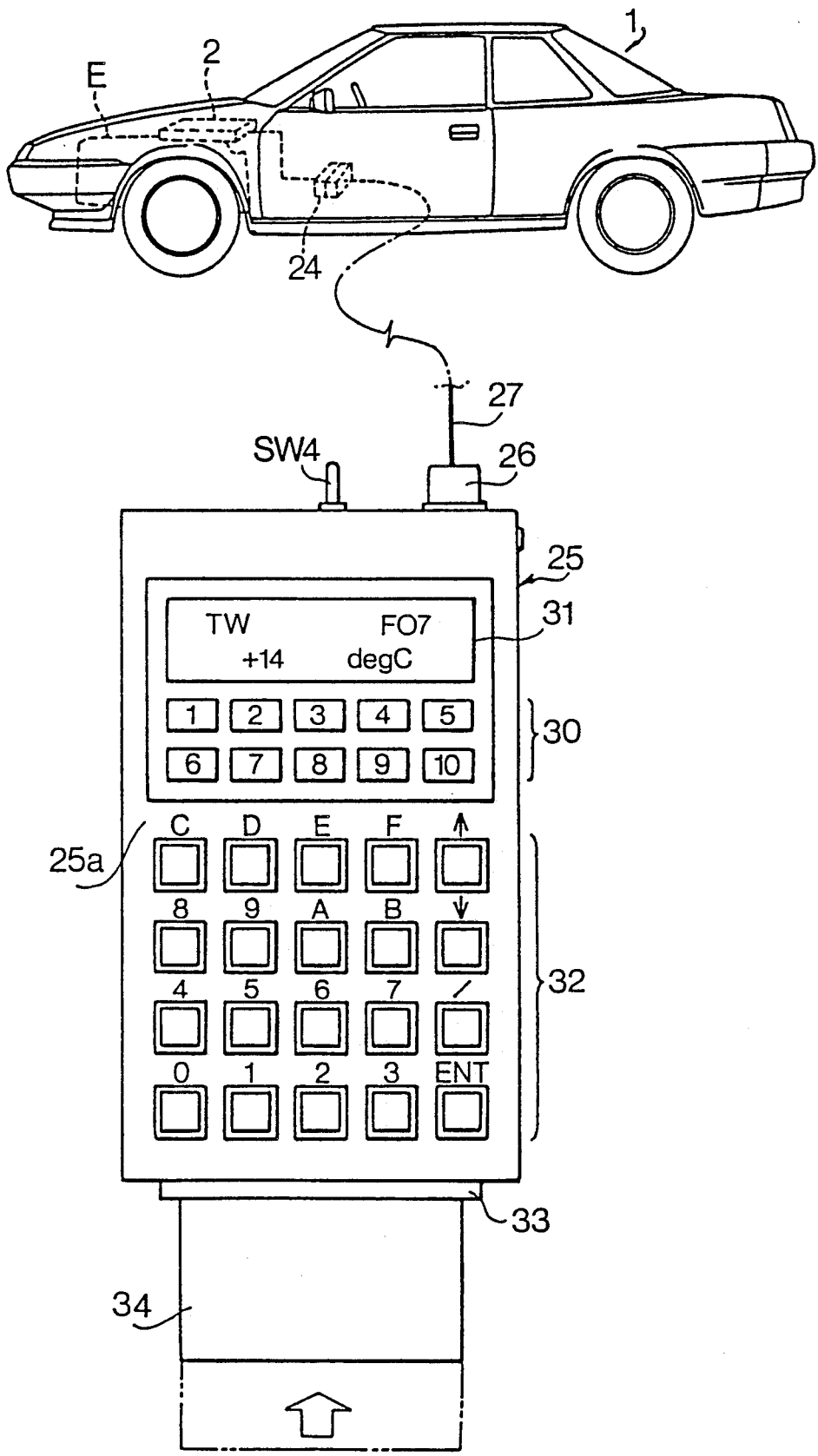
FIG. 1 is a schematic illustration of a diagnostic system according to the present invention.

Referring to FIG. 1, an automobile 1 is equipped with an electronic control system comprising an electronic control unit 2, a plurality of sensors and switches, and a plurality of actuators for controlling various components of an engine E. The electronic control unit 2 is connected to an external connector 24. A portable diagnostic device 25 comprising a microcomputer is housed in a case 25a and has a connector 26, to which the connector 24 of the unit 2 is connected through an adapter harness 27.

The diagnostic device 25 has a power switch SW4, a liquid crystal display 31, an indicator section 30 having a plurality of indicators of LED, and a keyboard 32. A connector 33 is provided for connecting a detachable memory cartridge 34.

Figure 2A:
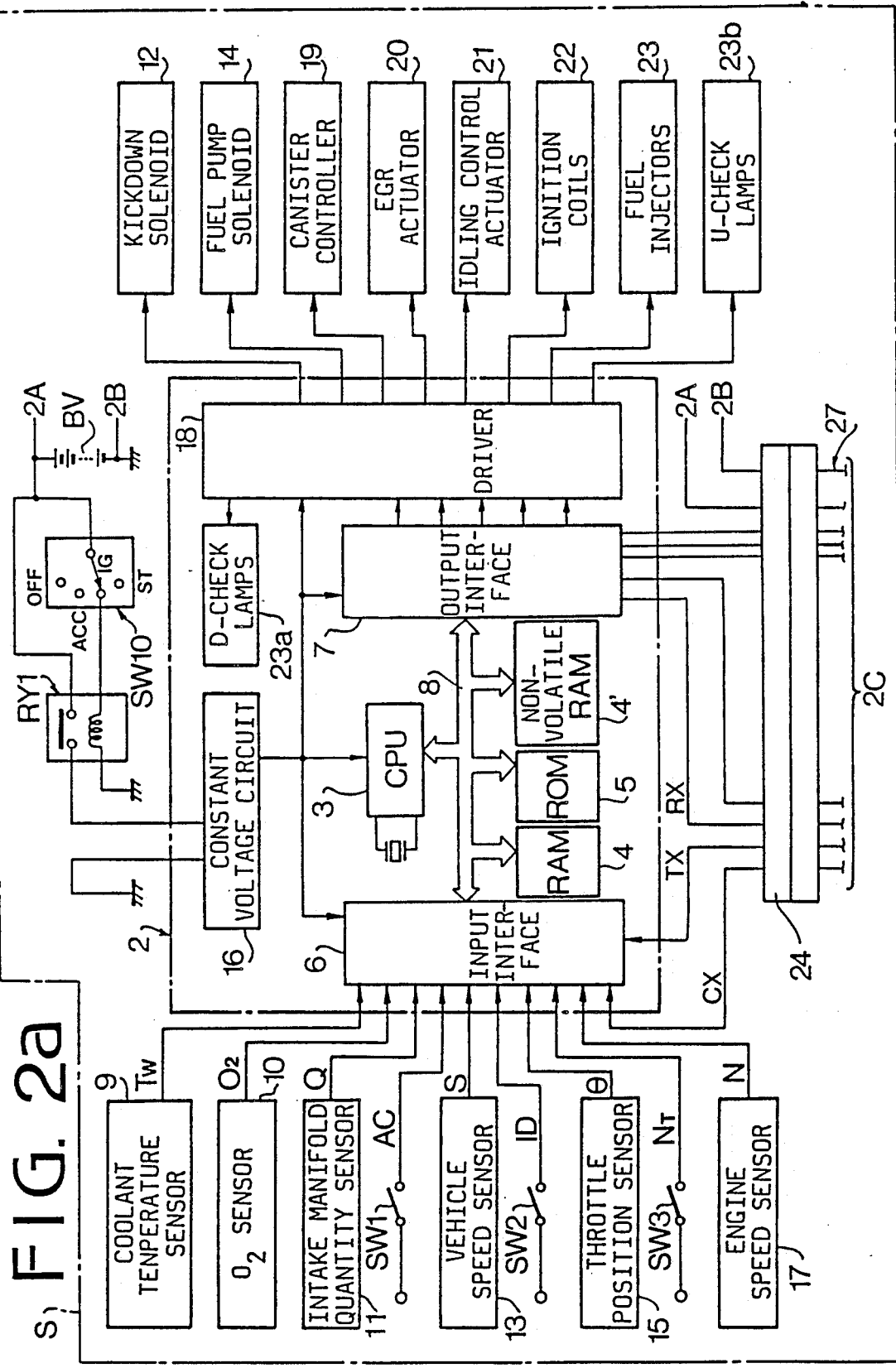
FIGS. 2a and 2b show a block diagram of the system.
Figure 2B:
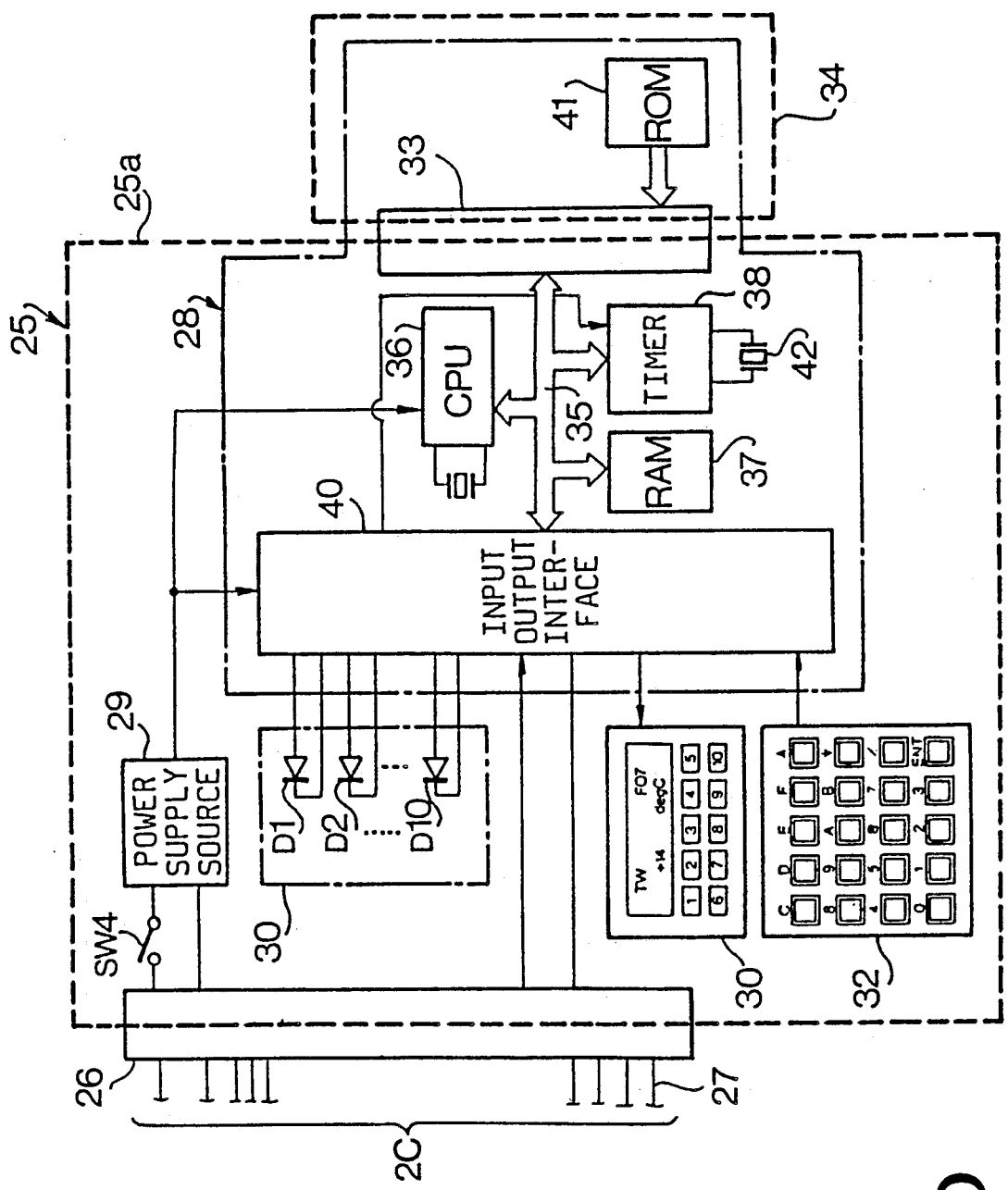

Referring to FIGS. 2a and 2b, the electronic control unit 2 comprises a central processor unit (CPU) 3, a random access memory (RAM) 4, a read only memory (ROM) 5, a random access memory (non-volatile RAM) 4a, an input interface 6 and an output interface 7. These CPU 3, RAMS 4 and 4a, ROM 5, input and output interfaces 6 and 7 are connected to each other through a bus line 8. Programs and data for controlling the engine and fixed data such as the type of the vehicle are stored in the ROM 5. Power is supplied to the CPU 3, input and output interfaces 6 and 7, and driver 18 from a source BV through a contact of a relay RY1 and a constant voltage circuit 16. A coil of the relay RY1 is connected to the source BV through an ignition key switch SW10.

The input interface 6 is applied with a coolant temperature signal Tw from a coolant temperature sensor 9, an air-fuel ratio feedback signal $O_2$ from an $O_2$ sensor 10, an intake-air quantity signal Q from an intake manifold quantity sensor 11, an air conditioner operating signal AC from an air conditioner switch SW1, a vehicle speed signal S from a vehicle speed sensor 13, an idling signal ID from an idle switch SW2, a throttle valve opening degree signal $\theta$ from a throttle position sensor 15, a neutral positioning signal NT from a neutral switch SW3 in a transmission, and an engine speed signal N from an engine speed sensor 17.

These signals are stored in the RAM 4 after the processing of data in accordance with the program stored in the ROM 5. The CPU 3 produces respective control signals, which are applied to the driver 18 through the output interface 7. The driver 18 produces signals for controlling a kickdown solenoid 12, a fuel pump solenoid 14, a canister controller 19 of a fuel-vapor emission control system, an EGR (exhaust gas recirculation system) actuator 20, an idling control actuator 21, ignition coils 22 and fuel injectors 23.

The driver 18 further applies signals to D-check lamps 23a and U-check lamps 23b. The D-check lamps 23a are provided in the electronic control unit 2 for indicating an abnormality in the unit 2. When an abnormality is detected in the unit 2 by a self-diagnosis function, a corresponding trouble code is read out from the ROM 5 so as to turn on or flash a plurality of the lamps 23a, thereby indicating the trouble code. The U-check lamps 23b are provided on a dashboard of the vehicle so as to warn the driver of the trouble detected by the self-diagnosis function.

Trouble data of the detected abnormality is stored in the non-volatile RAM 4a.

The diagnostic device 25 has a diagnosis control unit 28 and a power supply source 29. The control unit 28 comprises a CPU 36, a RAM 37, an input/output (I/O) interface 40, a timer 38, and a ROM 41 in the memory cartridge 34. These elements are connected to each other through a bus line 35. A clock pulse generator 42 is provided in the timer 38 for generating synchronizing pulses.

Inputs of the I/O interface 40 are connected to the output interface 7 of the control unit 2 through connectors 24 and 26 and harness 27 so as to receive output signals of control unit 2. Outputs of the interface 40 are connected to the indicator section 30. The indicator section 30 has a plurality of LEDs $D_1$ to $D_{10}$ which are operated through switches. When one of the switches is turned on, a corresponding LED of LEDs $D_1$ to $D_{10}$ is lighted or intermittently lighted, so that the operation of the switch can be confirmed. Inputs of the I/O interface 40 are connected to the keyboard 32 for receiving a mode select signal dependent on the operation of the keyboard, and to the output interfaces 7. Outputs of interface 40 are connected to the input interface 6 and the display 31. The power source 29 for supplying the power to the CPU 36 and I/O interface 40 is connected to the source BV through the power switch SW4.

The memory cartridge 34 selected for diagnosing the presented control unit 2 is connected to the diagnostic device 25 through the connector 33. A ROM 41 provided in the memory cartridge 34 stores control programs corresponding to the vehicle type and fixed data.

Figure 3:
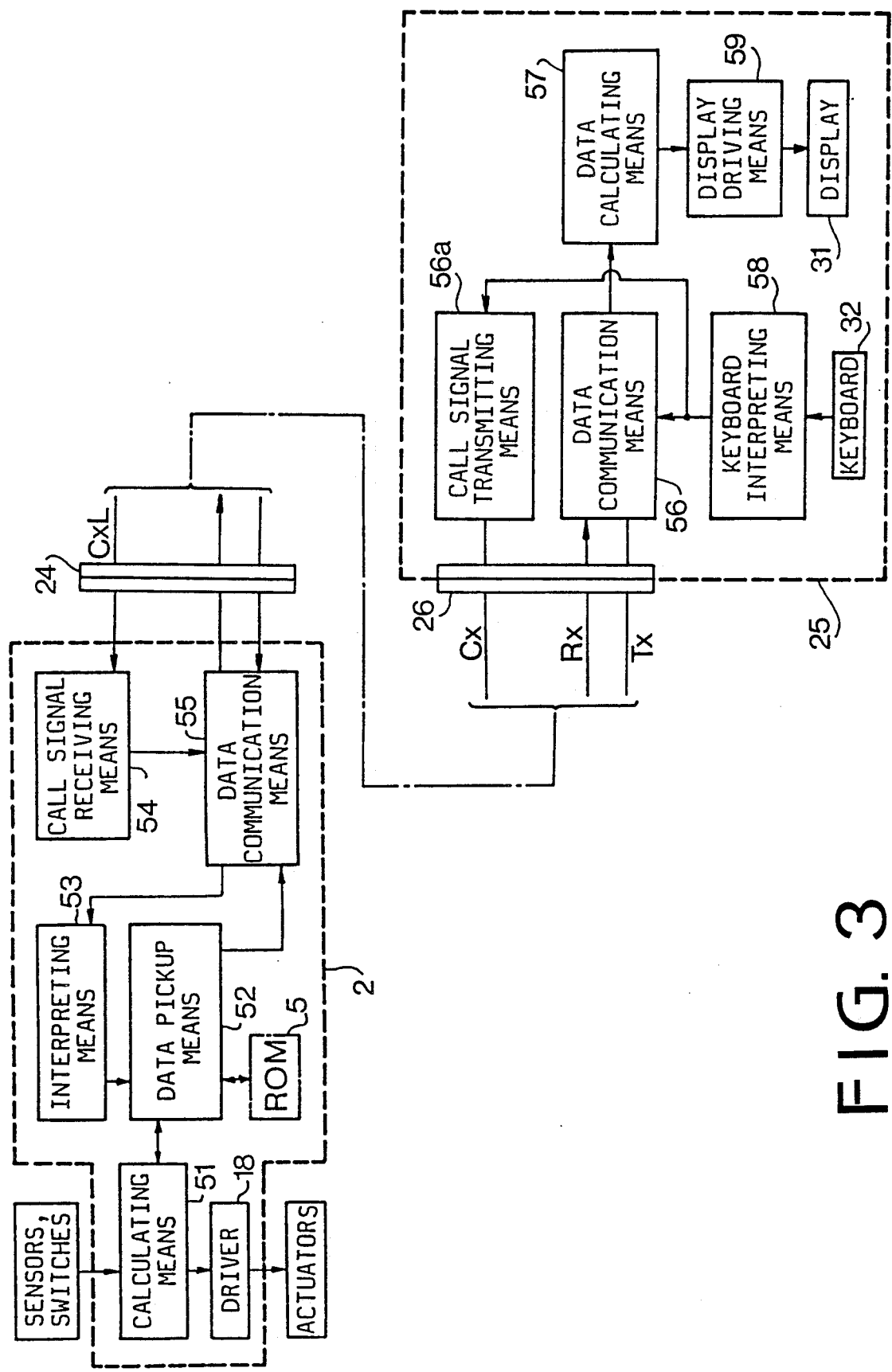
FIG. 3 is a block diagram showing a main part of the system.

Referring to FIG. 3, the electronic control unit 2 has calculating means 51 for calculating signals from the sensors and switches, and the driver 18 connected to the calculating means 51 for supplying the actuating signals to the respective actuators. The electronic control unit 2 has further a call signal receiving means 54 and a data communication means 55 which are connected to the connector 24 through a bus line. The call signal receiving means 54 is provided for receiving a call signal from the diagnostic device 25. In response to the call signal, the call signal receiving means 54 renders the data communication means 55 in a signal responsive and transmissive state. Thus, the data communication means 55 receives various demand signals from the diagnostic device 25, which in turn are supplied to an interpreting means 53. Interpreting means 53 is provided for interpreting the content of the data demand signal and producing a pickup signal which is applied to a data pickup means 52. In accordance with the pickup signal, the data pickup means 52 pick ups necessary data from data calculated in the calculating means 51 or data stored in ROM 5, and produces a data signal RX. The data signal RX is supplied to the diagnostic device 25 through data communication means 55. The control unit 28 of the diagnostic device 25 comprises a call signal transmitting means 56a which is connected to the call signal receiving means 54 through the connectors 26, 24 and a call signal line CXL. The control unit 28 further comprises a keyboard interpreting means 58, and a data communication means 56. The keyboard interpreting means 58 is provided for interpreting a command signal input through the keyboard 32 for calling the control unit 2. In accordance with the interpreted command signal, the call signal transmitting means 56a produces a call signal CX which is applied to the control unit 2. The call signal comprises a high level signal and a low level signal. The high level call signal permits the control unit 2 to transmit data to the diagnostic device 25. The low level call signal inhibits the data transmission from the control unit 2.

Further, the keyboard interpreting means 58 interprets a diagnosis mode input by operating the keyboard 32 and produces a mode signal. The data communication means 56 produces a data demand signal TX in accordance with the diagnosis mode, which is applied to the control unit 2 and receives data signal RX fed from the control unit 2. A data calculating means 57 calculates the data received at the data communication means 56 for converting the received binary digits into decimal digits. A display driving means 59 produces a signal in accordance with the output of the data calculating means 57 for driving the display 31.

In order to transmit the call signal CX from the call signal transmitting means 56a, an independent call signal key may be provided for inputting a command signal instead of the keyboard operation.

Figure 4A:
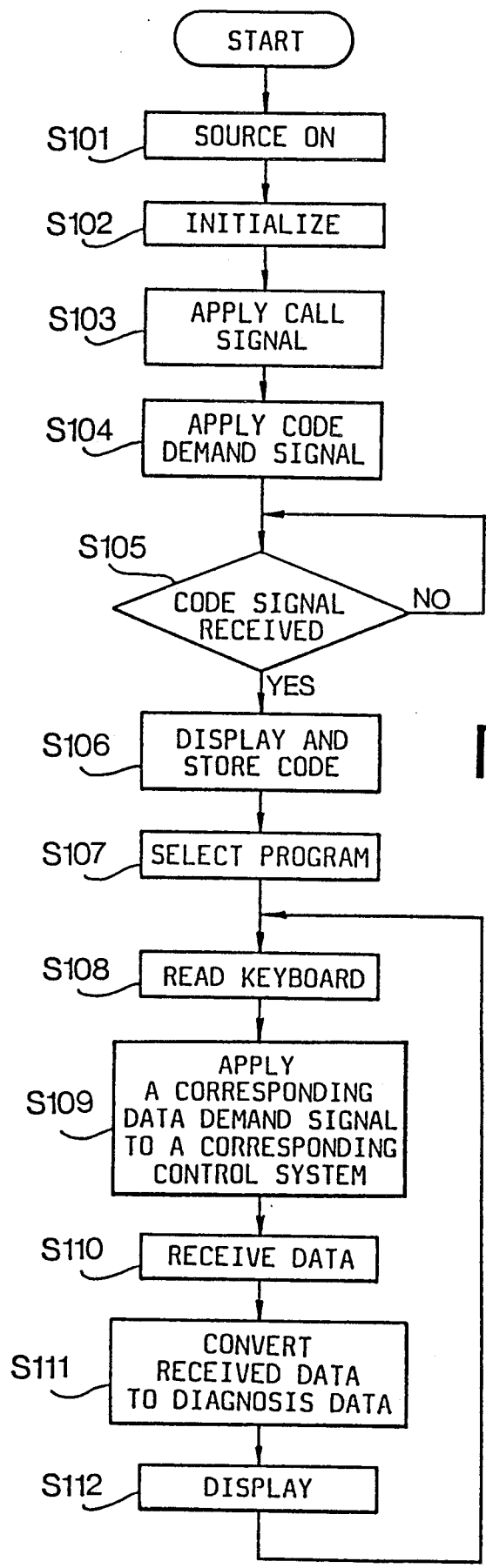
FIG. 4a is a flowchart showing an operation of a diagnostic device in the system.

The operation of the diagnostic system is described hereinafter with reference to the flowchart of FIGS. 4a and 4b. The diagnostic device 25 is connected to the electronic control system 2 through the connectors 24, 26 and harness 27. The engine is started, and the following diagnosis program is performed under the running condition of the engine.

The power switch SW4 is turned on at a step S101. At a step S102, initialization of the control unit 28 is performed. At a step S103, a call signal CX is applied from the call signal transmitting means 56a to the control unit 2. At a step S104, a data demand signal TX from the data communication means 56 is applied to the control unit 2. The data demand signal TX is previously stored in the ROM 5.

The data demand signal TX includes a demand signal for demanding an identification code of the control unit 2.

Figure 4B:
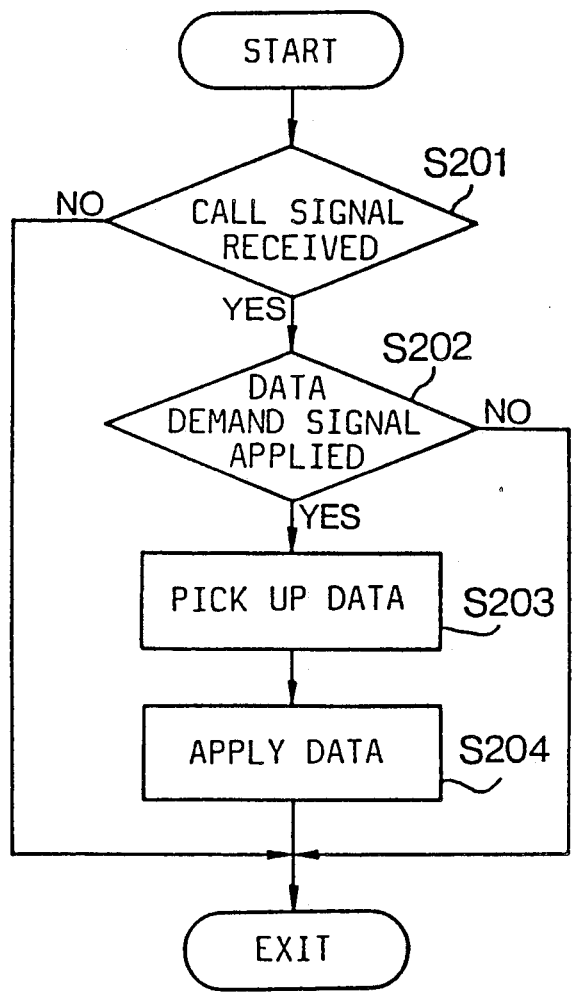
FIG. 4b is a flowchart showing an interrupt routine.

When the call signal CX is applied to the control unit 2, the program of an interrupt routine shown in FIG. 4b starts.

At step S201, it is determined whether the call signal CX from the diagnostic device 25 is applied to the call signal receiving means 54 or not. When the call signal is applied, the data communication means 55 is rendered in a signal transmittable state, and the program proceeds to a step S202. If no signal is applied, the signal transmission of the data communication means 55 is inhibited and then the program proceeds to an exit to wait for the next call signal.

At step S202, the interpreting means 53 determines whether the data communication means 55 receives a data demand signal TX or not. In that program, the data demand signal is determined as the data demand signal TX for demanding the identification code. The program goes to a step S203. If no signal is applied, the program proceeds to the exit to wait for the next signal. At step S203, the interpreting means 53 supplies a signal to the data pickup means 52 to read out an identification code data from the data stored in the ROM 5. At a step S204, a derived identification code data signal RX is fed from the data communication means 55 to the diagnostic device 25.

While the call signal from the diagnostic device 25 is continuously applied to the control unit 2, the program for transmitting the data of the identification code is continued, when the compulsory operation of the control unit 2 is interrupted. At a step S105, it is determined whether the identification code data signal RX is applied to the diagnostic device 25 or not. If the identification code data signal RX is applied, the program proceeds to a step S106. If not, the program of step S105 is repeated. At step S106, a received code is stored in a predetermined address of the RAM 37. At a step S107, in accordance with the received code, a program for the type of the control unit 2 is selected from the ROM 41 in the cartridge 34. Thus, a diagnostic routine is performed in accordance with the selected program.

A diagnostician operates the keyboard 32 to perform the diagnosis of the engine control unit 2. For example, in order to measure the coolant temperature, a mode code for the coolant temperature (for example F→0→7→ENT) is input by operating the keyboard 32 at a step S108. The input mode is read by the CPU 36 and temporarily stored in the RAM 37. Thereafter, the mode is read and interpreted in the keyboard interpreting means 58. A program according to a mode representing a coolant temperature sensor output data program is read out. At a steps 109, a corresponding data demand signal TX (for example, coolant temperature data) is applied to the control unit 2 from the data communication means 56.

In accordance with the data demand signal TX, programs of interrupt routines are started.

At that time, the engine control unit 2 is in signal transmitting state for the identification code demand signal. Thus, the program goes from step S202 to step S204 where a data demand signal for coolant temperature is interpreted at the interpreting means 53. The data demand signal TX for coolant temperature is applied to the data pickup means 52. The data pickup means 52 interrupts the identification code pickup operation and operates to pick up coolant temperature data which is supplied to the diagnostic device 25 through the data communication means 55.

At a step S110, data signal RX representing a coolant temperature is applied to the data communication means 56 from the control unit 2. At a step S111, the received binary digit is converted into a decimal digit representing the coolant temperature in the data calculating means 57.

The driving means 59 produces a calculated data which is applied to the display 31. At a step S112, a value of the coolant temperature, for example, +14 deg C. representing the temperature, an abbreviation mark TW of the coolant temperature, and an input mode indication F07 are displayed on the display 31 as shown in FIG. 1. Thus, the diagnostician can diagnose the items about the coolant temperature.

In order to terminate the data signal transmitting operation of the control unit 2, a predetermined demand code for terminating the call signal transmission is input by operating the keyboard 32 or a predetermined key to stop the transmission of the call signal. For example, the call signal CX is caused to go to a low level.

When the call signal CX is not received, the call signal receiving means 54 produces a signal for immediately inhibiting the data communication means 55 from transmitting the data, and the data pickup operation of the data pickup means 52 is terminated, the transmission line being cut off.

In accordance with the present invention, the data transmission from the control unit 2 to the diagnostic device 25 can be terminated in a moment. Thus, load exerted on the CPU of the control unit 2 is reduced, so that malfunctioning of the engine can be prevented even if the engine is driven at a high speed.

Referring to FIG. 5 showing a second embodiment of the present invention, an automobile 100 is equipped with an electronic control system comprising a plurality of electronic operation control units for controlling various operations of the automobile 100 such as an electronic engine control unit 101 for controlling air-fuel ratio of the engine and others, an electronic transmission control unit 102, an electronic brake control unit 103 for controlling an antilock brake system, and an electronic cruise control unit 104 for constant speed driving of the automobile. These electronic control units are connected to the external connector 24.

In the second embodiment, since the diagnostic device 25 has the same structure as the first embodiment, description thereof is omitted. Other features which are the same as the previous embodiment and the same parts thereof are identified with the same reference numerals as FIGS. 1 to 4.

Figure 6A:
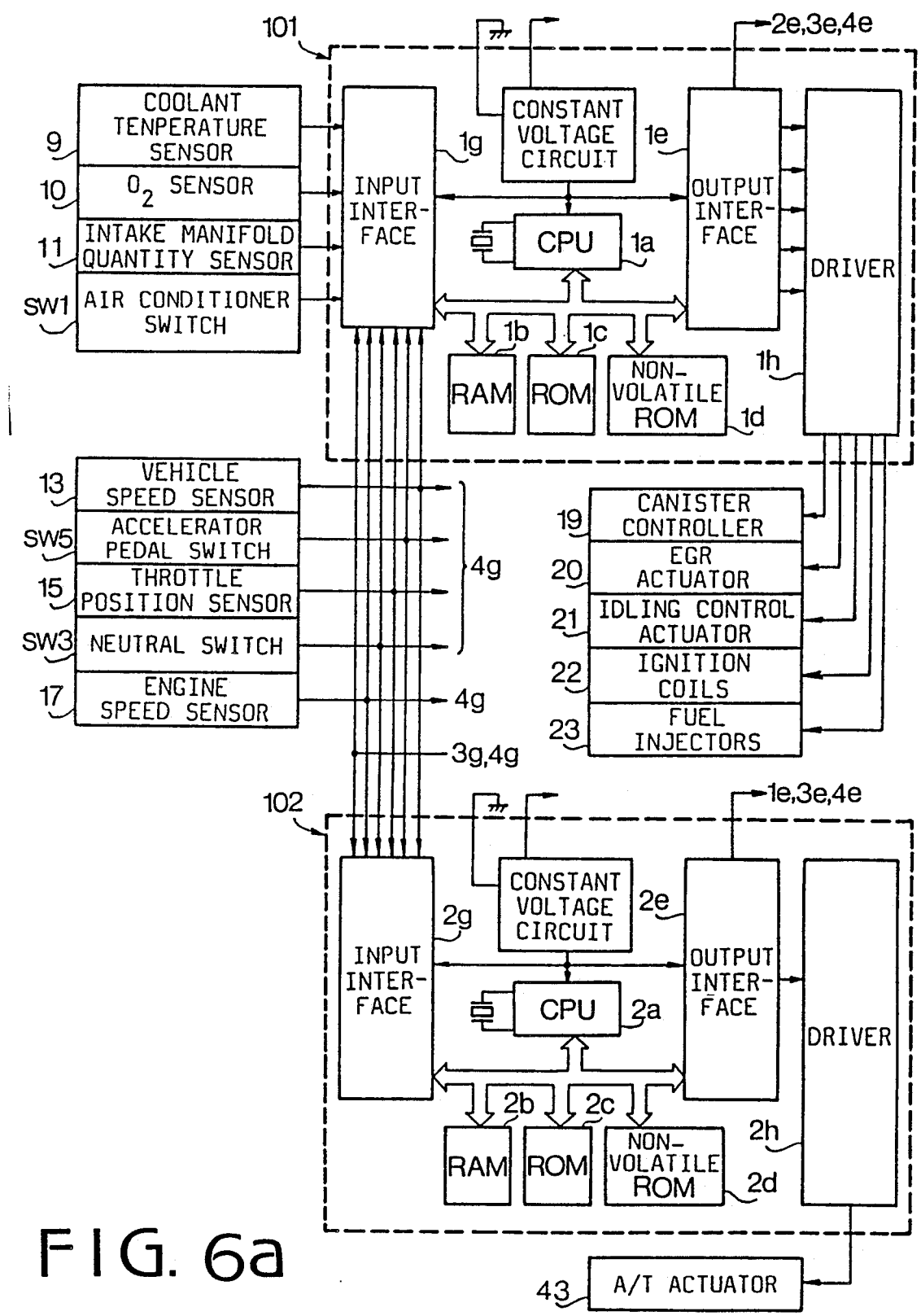
FIGS. 6a to 6c are block diagrams of a diagnostic system of FIG. 5.
Figure 6B:
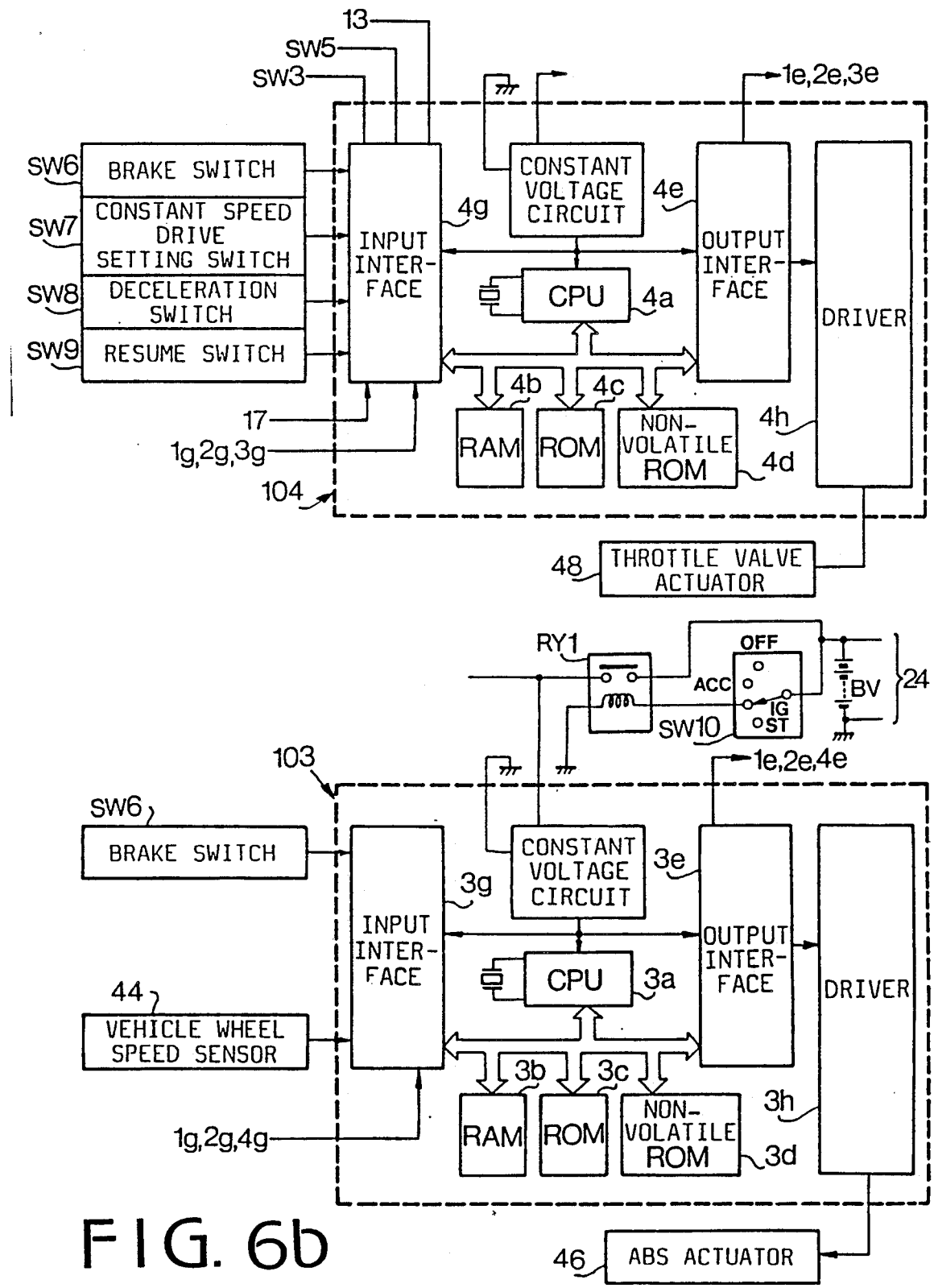
Figure 6C:
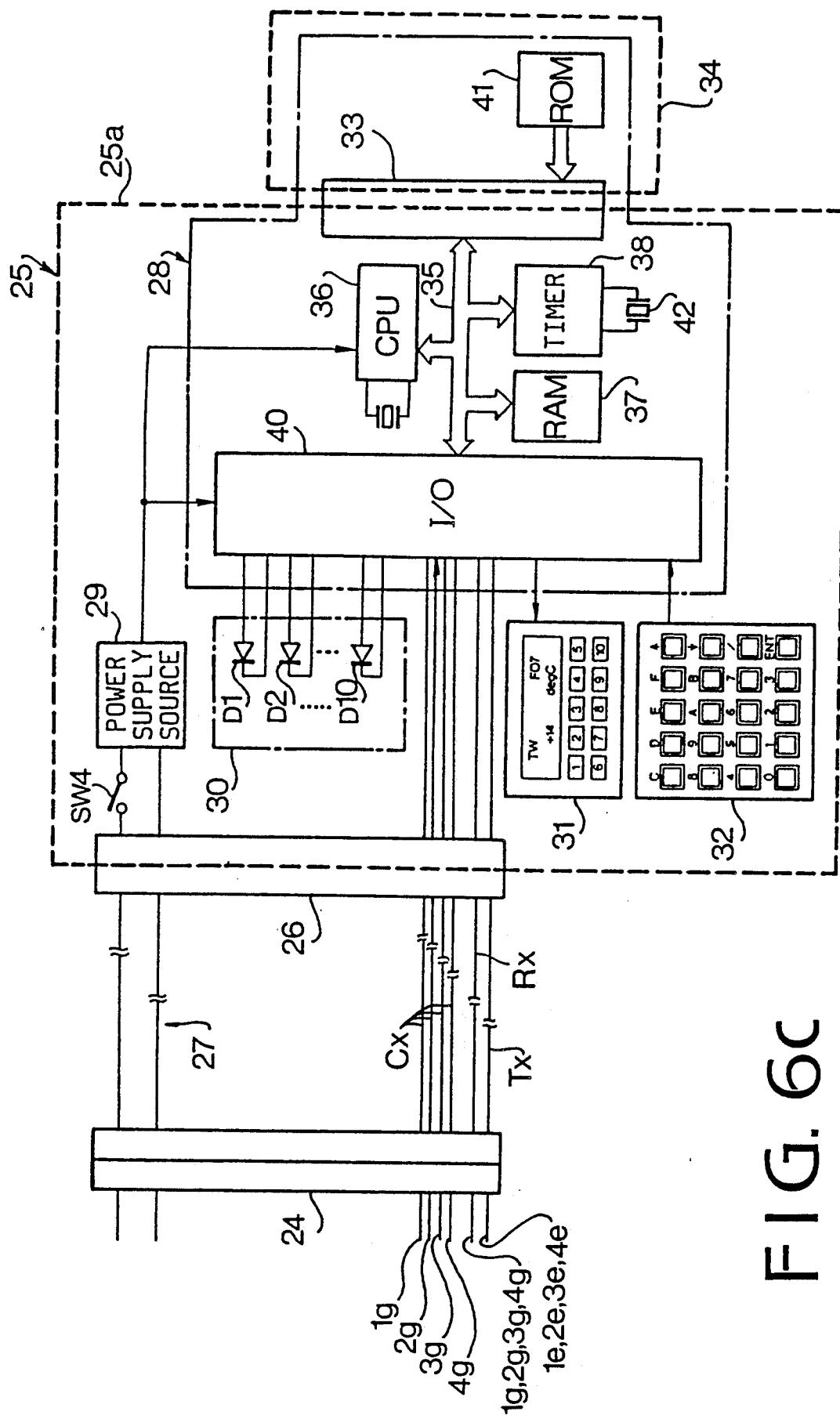

Referring to FIGS. 6a to 6c, the electronic operation control units 101, 102, 103 and 104 have central processor units (CPUs) 1a, 2a, 3a and 4a, random access memories (RAMs) 1b, 2b, 3b and 4b, read only memories (ROMs) 1c, 2c, 3c and 4c, non-volatile random access memories 1d, 2d, 3d and 4d, input interfaces 1g, 2g, 3g and 4g, and output interfaces 1e, 2e, 3e and 4e, respectively. These CPU, RAMs, ROM, input and output interfaces in each control unit are connected to each other through a bus line. In the RAMs 1b to 4b, various processed parameters and tables are stored. Programs and data for controlling the engine and fixed data such as the type of the vehicle are stored in the ROMs 1c to 4c. Power is supplied to the CPUs, input and output interfaces, and drivers of the systems from the source BV.

The electronic engine control unit 101 receives signals from the coolant temperature sensor 9, the $O_2$ sensor 10, the intake manifold pressure sensor 11, the air conditioner switch SW1, the vehicle speed sensor 13, an accelerator pedal switch SW5, the throttle position sensor 15, a neutral switch SW3 and an engine speed sensor 17 through the input interface 1g.

These signals are stored in the RAM 1b after the processing of data in accordance with the program stored in the ROM 1c. The CPU 1a produces respective control signals, which are applied to a driver 1h through the output interface 1e. The driver 1h produces signals for controlling the canister controller 19, the actuator 20, the idling control actuator 21, ignition coils 22 and fuel injectors 23.

The electronic transmission control unit 102 receives signals from the engine speed sensor 17, vehicle speed sensor 13, accelerator pedal switch SW5, throttle position sensor 15 and neutral switch SW3 through the input interface 2g. The CPU 2a produces a signal which is supplied to an A/T (automatic transmission) actuator 43 through the output interface 2e and a driver 2h, for controlling the transmission in response to driving conditions.

The electronic brake control unit 103 receives signals from a brake switch SW6 and a vehicle wheel speed sensor 44 through the input interface 3g. These signals are processed in accordance with the program stored in the ROM 3c for controlling an antilock brake system. A control signal is applied to an ABS actuator 46 through the output interface 3e and a driver 3h.

The electronic cruise control unit 104 is supplied with signals from a constant speed drive setting switch SW7 and vehicle speed sensor 13 through the input interface 4g. A control signal is supplied to a throttle valve actuator 48 through the output interface 4e and a driver 4h for controlling constant speed drive of the vehicle. When signals from the brake switch SW6, neutral switch SW3, engine speed sensor 17, the accelerator pedal switch SW5, a deceleration switch SW8 and a resume switch SW9 are supplied to the input interface 4g, release of the constant speed drive or decelerated constant speed drive are performed.

In these operation control units 101, 102, 103 and 104, input interfaces 1g to 4g are connected to each other in parallel and output interfaces 1e to 4e are connected to each other in parallel so that bus lines comprising signal transmitting lines and signal receiving lines are formed. These lines are connected to the connector 24.

Figure 7A:
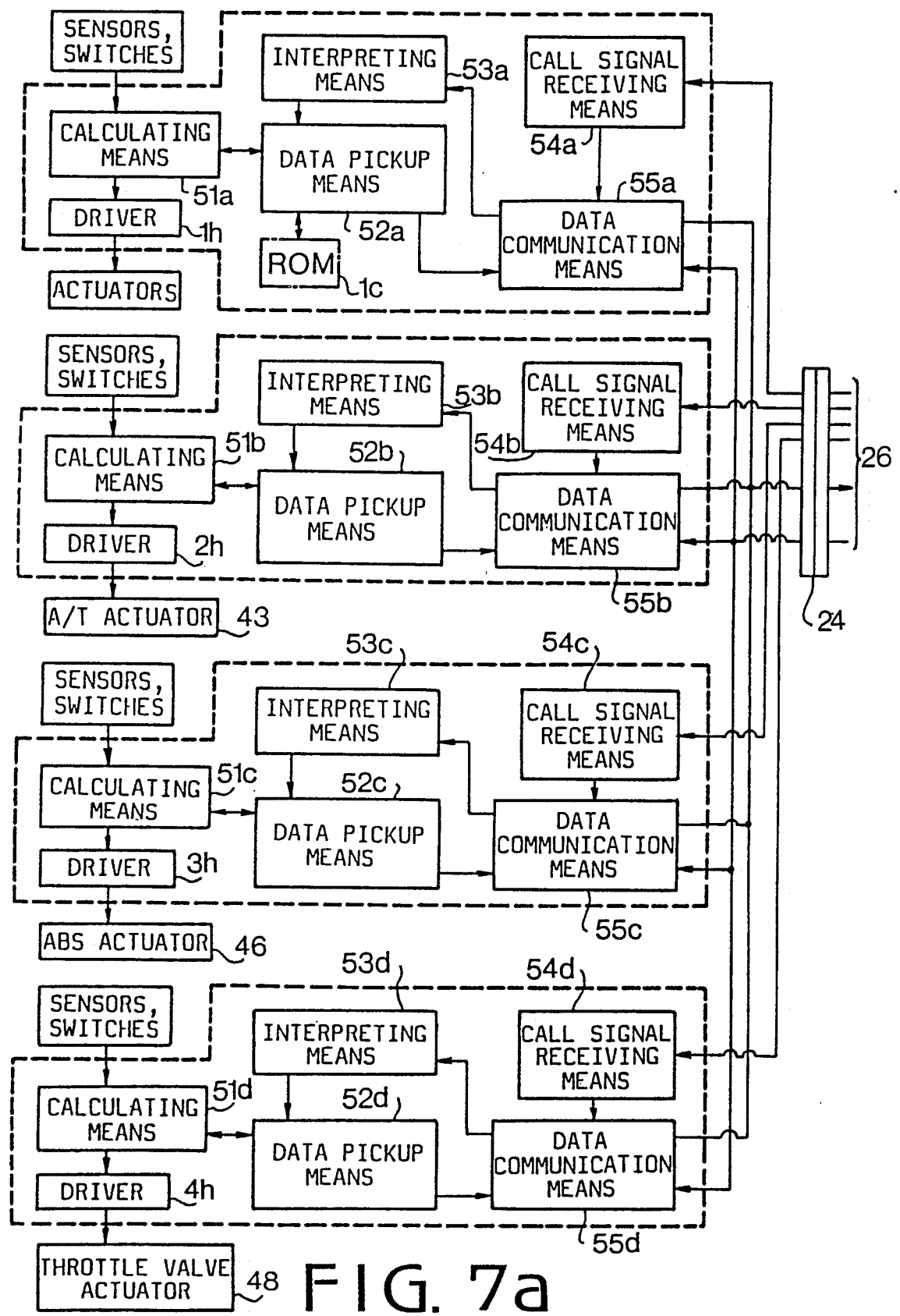
FIGS. 7a and 7b are block diagrams showing a main part of the system of FIG. 5.
Figure 7B:
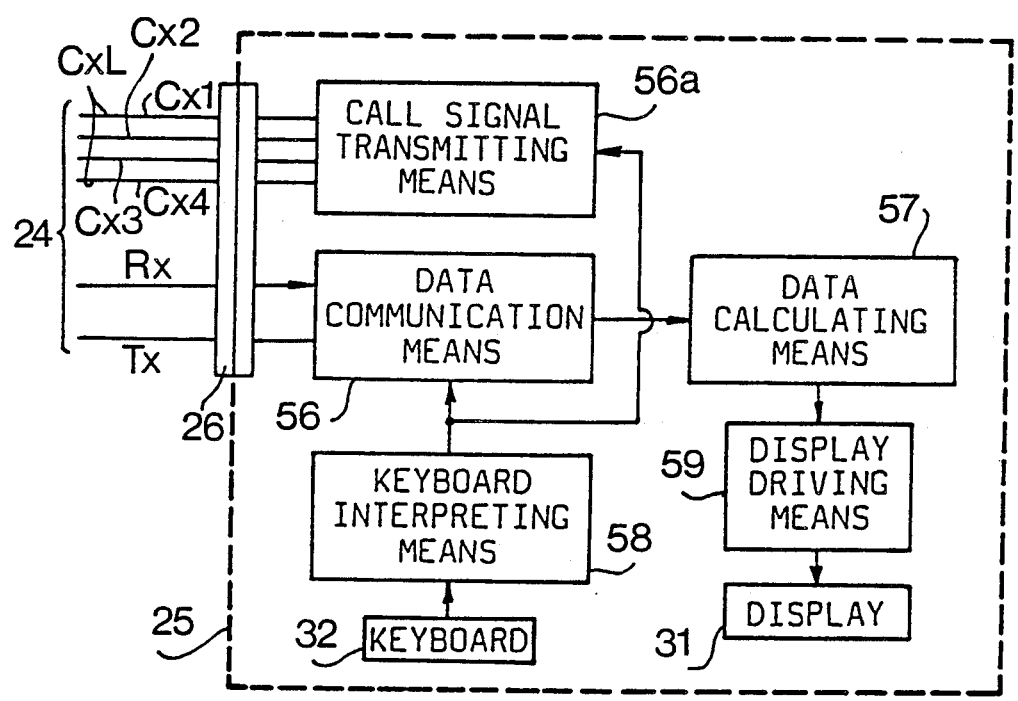

Referring to FIGS. 7a and 7b, there are provided four call signal lines CXL between the diagnostic device 25 and the responsive control units 101 to 104. Each of the control units 101 to 104 has the same structure as the control unit 2 of the first embodiment. Namely, calculating means 51a to 51d, data pickup means 52a to 52d, interpreting means 53a to 53d, call signal receiving means 54a to 54d, and data communication means 55a to 55d are provided in the control units 101 to 104, respectively.

Data communication means 55a to 55d are connected to each other in parallel. Call signal receiving means 54a to 54d are independently connected to the call signal transmitting means 56a in the diagnostic device 25 through the connector 24.

The operation of the diagnosis system is described hereinafter with reference to the flowchart of FIGS. 4a and 4b in the same manner as the first embodiment. The diagnostic device 25 is connected to the electronic control units 101 to 104 through the connectors 24, 26 and harness 27. The engine is started, and the following diagnosis program is performed under the running condition of the engine.

The power switch SW4 is turned on at a step S101. At a step S102, initialization of the control unit 28 is performed. At a step S103, a call signal CX1 in the form of clock pulses is applied from the call signal transmitting means 56a to the engine control unit 101. At a step S104, a data demand signal TX for demanding an identification code from the data communication means 56 is applied to the engine control unit 101. The data demand signals TX are previously stored in the ROM 1c.

When the call signal CX1 is applied to control unit 101, its own compulsory operation in the control unit 101 is interrupted and the control unit 101 starts a program of an interrupt routine shown in FIG. 4b. Namely, it is determined whether a call signal CX1 is applied to the call signal receiving means 54a of the unit 101 or not. In this program, since the call signal CX1 is applied to the engine control unit 101, the program for the engine control unit 101 proceeds to step S201 and programs for the other control units 102 to 104 continue their own operations.

At that time, the bus lines of the signal transmitting means 55b to 55d to the diagnostic device 25 are opened.

At step S201, the data communication means 55a of the engine control unit 101 is rendered responsive by the call signal receiving means 54a and the data communication means 55a is connected to the diagnostic device 25. Thus, the program goes to a step S202 where the interpreting means 53a determines whether the data transmission demand signal TX is applied to the data communication means 55a. The program goes to step S203 where the interpreting means 53a supplies a signal to the data pickup means 52a to read out an identification code data from the data stored in the ROM 1c. The program proceeds to step S204 where a derived identification code data signal RX is fed from the data communication means 55a to the diagnostic device 25 in synchronism with the call signal CX1.

In the diagnostic device 25, the data signal RX is processed in the same manner as described in the first embodiment and a diagnosis routine is performed in accordance with the program. For example, in order to measure the coolant temperature, a mode code for the coolant temperature is input by operating the keyboard 32. A corresponding data demand signal TX of coolant temperature data in the engine control unit 101 is applied to the control unit 101 from the diagnostic device 25 in synchronism with the call signal CX1. Thus, the program goes from step S201 to step S204 where a data demand signal TX for coolant temperature is interpreted at the interpreting means 53a. The data demand signal TX for coolant temperature is applied to the data pickup means 52a. The data pickup means 52a interrupts the identification code pickup operation and operates to pick up coolant temperature data which is supplied to the data communication means 55a. Data signal RX representing a coolant temperature is applied to the data communication means 56 from the data communication means 55a in synchronism with the call signal CX1. The data signal RX is processed in the diagnostic device 25 and a value of the coolant temperature, for example, +14 deg C. representing the temperature, an abbreviation mark TW of coolant temperature, and the input mode indication F07 are displayed on the display 31 as shown in FIG. 5. Thus, the diagnostician can diagnose the items about the coolant temperature.

In order to perform other diagnosis items, for example, to diagnose vehicle wheel speed data based on a signal from the vehicle wheel speed sensor 44 of the brake control unit 103, the diagnostician operates the keyboard 32 to stop transmitting the call signal CX1 generated from the call signal transmitting means 56a and to input a demand code for a call signal CX3 which is applied from the call signal transmitting means 56a to the brake control unit 103. Further, the diagnostician operates the keyboard 32 to input a mode code for the vehicle wheel speed (for example F→B→1→ENT) (step S108). The input mode is read and interpreted at the keyboard interpreting means 58. At step S109, a corresponding data demand signal TX for vehicle wheel speed is applied to the control units 101 to 104 in synchronism with the call signal CX3.

At that time, the engine control unit 101 is under the condition for transmitting the coolant temperature data. Accordingly, when the transmission of the call signal CX1 is stopped, the data communication means 55a is operated to inhibit the data transmission operation and the signal transmitting operation of the data communication means 55a is terminated so that the line to the diagnostic device 25 is opened. The data pickup means 52a terminates the pickup operation for the coolant temperature data and program of the control unit 101 continue its own operation.

Simultaneously, control units 102 to 104 start the interrupt routine. Since the brake control unit 103 receives the call signal CX3 at step S201, the program of the brake control unit 103 goes to a step S202. Programs of the control units 102 and 104 continue their own operations.

At step S201, the data communication means 55c of the brake control unit 103 becomes in a signal transmitting state. Thus, the data communication means 55c is connected to the diagnostic device 25. At step S202, data transmission demand is determined and a data demand signal is applied from the interpreting means 53c to the data pickup means 52c. The program goes to a step S203 where the interpreting means 53c supplies a signal to the data pickup means 52c to read out the vehicle wheel speed data from the data stored in the ROM 3c. At step S204, a derived vehicle wheel speed data signal is fed from the data communication means 55c to the diagnostic device 25.

At a step S110, data signal RX representing the vehicle wheel speed is applied to the data communication means 56 from the control unit 103. At a step S111, the received binary digits are converted into decimal digits representing the vehicle wheel speed in the data calculating means 57. At a step S112, a calculated value of the vehicle wheel speed is displayed on the display 31.

Finally, in order to terminate the diagnosis operation, the transmission of the call signal CX3 is stopped by operating the keyboard 32. Thus, in the brake control unit 103, the call signal receiving means 54c operates to inhibit data transmission operation of the data communication means 55c and the pickup operation of the data pickup means 52c is terminated. Thus, the signal transmitting line to the diagnostic device 25 is opened.

In the present invention, diagnosis of a plurality of electronic control units 101 to 104 can be performed by connecting them to the diagnostic device 25 through the single external connector 24. For example, the vehicle speed data from the vehicle speed sensor 13, which is necessary for the engine control unit 101, transmission control unit 102, and cruise control unit 104, can be diagnosed by inputting a corresponding diagnosis mode through the keyboard 32. More particularly, if vehicle speed data in all of the control units 101, 102 and 104 are abnormal, it is diagnosed that the vehicle speed sensor 13 is in trouble. If vehicle speed data in one of the control units 101, 102 and 104 is abnormal, trouble such as faulty contact of the connector or a short circuit in the control unit and the sensor 13, breaking of wires, or mulfunction of that control system are assumed.

Further, since the call of the control unit is electrically performed in accordance with a call signal CX, a complicated protocol of the program is omitted, thereby ensuring the communication of the control unit with the diagnostic device through a simple interface.

In accordance with the present invention, in order to diagnose the control unit, a necessary control unit is immediately called in accordance with a corresponding call signal. Thus, load exerted on the control unit is reduced. Even if a plurality of control units have trouble, data transmission from the other control unit can be easily performed by changing the call signal. Thus, workability is improved and trouble in the control units can be easily discovered.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. A diagnosis system for an electronic control system mounted on a motor vehicle, the control system having sensing means for detecting operating conditions of the vehicle and for producing an operating condition signal, and means for storing input data from said sensing means and providing output data for controlling the vehicle, and the diagnosis system comprising diagnosis means responsive to and diagnosing data from the electronic control system and for providing diagnosis data, display means for displaying said diagnosis data, a keyboard for inputting a diagnosis mode into said diagnosis means and for producing a code signal, a detachable memory cartridge detachably connected to said diagnosis means for storing a plurality of programs to diagnose said diagnosis data and for producing a diagnosis signal, data communication means provided in said diagnosis means for alternatively transmitting data between said electronic control system and said diagnosis means, and connecting means for connecting said diagnosis means with said electronic control system and said detachable memory cartridge, different types of data signals being transmitted from said electronic control system by a demand signal from said data communication means, the improvement wherein:

said diagnosis means comprises:
keyboard interpreting means responsive to said code signal for determining said diagnosis mode and for generating a corresponding command signal; and
call signal transmitting means responsive to said command signal for selecting a data communication means in said electronic control system with respect to said diagnosis data and for transmitting a call signal;
said electronic control system includes at least one call signal receiving means responsive to said call signal for selecting and rendering in a signal transmittable state said data communication means in said electronic control system in accordance with said call signal; and
said diagnosis means further comprises data calculating means responsive to data from said data communication means in said diagnosis means for calculating said diagnosis data and for producing a driving signal to display said diagnosis data on said display means so as to immediately diagnose trouble in said electronic control system without exerting further load on said diagnosis system, whereby absence and presence of the call signal respectively stops and restarts communication between the electric control system and the dianosis system by the data communication means in the electronic control system.

2. The diagnosis system according to claim 1, wherein
the diagnosis system includes a computer having a central processing unit and a memory, the memory storing a plurality of diagnosis programs corresponding to the type of the vehicle for diagnosing the electronic control system.

3. The diagnosis system according to claim 1, wherein
the electronic control system comprises a plurality of operation control units, and the plurality of operation control units include a plurality of said call signal receiving means, respectively, which are connected with said call signal transmitting means of the diagnosis means through respective call signal lines.

4. The system according to claim 3, wherein
said plurality of operation control units include a plurality of said data communication means of said electronic control system, respectively, connected to each other in parallel, to said data communication means of said diagnosis means, and to said plurality of call signal receiving means, respectively.

5. A diagnosis system for an electronic control system mounted on a motor vehicle, the control system having sensing means for detecting operating conditions of the vehicle and for producing an operating condition signal, and means for storing input data from said sensing means and providing output data for controlling the vehicle, and the diagnosis system comprising diagnosis means responsive to and diagnosing data from the electronic control system and for providing diagnosis data, display means for displaying said diagnosis data, a keyboard for inputting a diagnosis mode into said diagnosis means and for producing a code signal, a detachable memory cartridge detachably connected to said diagnosis means for storing a plurality of programs to diagnose said diagnosis data and for producing a diagnosis signal, data communication means provided in said diagnosis means for alternatively transmitting data between said electronic control system and said diagnosis means, and connecting means for connecting said diagnosis means with said electronic control system and said detachable memory cartridge, different types of data signals being transmitted from said electronic control system by a demand signal from said data communication means, the improvement wherein:

said diagnosis means comprises:
a call signal key for providing a command signal;
call signal transmitting means responsive to said command signal for selecting a data communication means in said electronic control system with respect to said diagnosis data and for transmitting a call signal;
said electronic control system includes at least one call signal receiving means responsive to said call signal for selecting and rendering in a signal transmittable state said data communication means in said electronic control system in accordance with said call signal; and
said diagnosis means further comprises data calculating means responsive to data from said data communication means in said diagnosis means for calculating said diagnosis data and for producing a driving signal to display said diagnosis data on said display means so as to immediately diagnose trouble in said electronic control system without exerting further load on said diagnosis system, whereby absence and presence of the call signal respectively stops and restarts communication between the electric control system and the dianosis system by the data communication means in the electronic control system.

* * * * *